(12) United States Patent
Hsu

(10) Patent No.: US 7,450,793 B2
(45) Date of Patent: Nov. 11, 2008

(54) SEMICONDUCTOR DEVICE INTEGRATED WITH OPTO-ELECTRIC COMPONENT AND METHOD FOR FABRICATING THE SAME

(75) Inventor: Shih-Ping Hsu, Hsin-chu (TW)

(73) Assignee: Phoenix Precision Technology Corporation, Hsinchu (TW)

( * ) Notice: Subject to any disclaimer, the term of this patent is extended or adjusted under 35 U.S.C. 154(b) by 0 days.

(21) Appl. No.: 11/487,892

(22) Filed: Jul. 17, 2006

(65) Prior Publication Data
US 2007/0047869 A1    Mar. 1, 2007

(30) Foreign Application Priority Data
Aug. 29, 2005    (TW)    ............... 94129453 A

(51) Int. Cl.
*G02B 6/12*    (2006.01)
(52) U.S. Cl. ......................................... 385/14; 257/499
(58) Field of Classification Search ............ 385/14
See application file for complete search history.

(56) References Cited
U.S. PATENT DOCUMENTS

| | | | | |
|---|---|---|---|---|
| 4,528,259 A | * | 7/1985 | Sullivan | 430/312 |
| 5,394,490 A | * | 2/1995 | Kato et al. | 385/14 |
| 5,431,775 A | * | 7/1995 | Prince | 216/24 |
| 5,761,350 A | * | 6/1998 | Koh | 385/14 |
| 6,760,497 B1 | * | 7/2004 | Straub | 385/14 |
| 6,839,476 B2 | | 1/2005 | Kim et al. | |
| 6,996,305 B2 | * | 2/2006 | Kim et al. | 385/15 |
| 2001/0036331 A1 | * | 11/2001 | Pillkahn | 385/14 |
| 2004/0100781 A1 | * | 5/2004 | Bozso et al. | 361/767 |
| 2004/0264838 A1 | * | 12/2004 | Uchida et al. | 385/14 |

* cited by examiner

*Primary Examiner*—M. R. Connelly-Cushwa
*Assistant Examiner*—Rhonda S Peace
(74) *Attorney, Agent, or Firm*—Sawyer Law Group, LLP.

(57) ABSTRACT

A semiconductor device integrated with opto-electric component and method for fabricating the same provides a wafer with a plurality of optical transmitter/receiver components, and each of the optical transmitter/receiver components having an active surface and an opposite non-active surface, wherein a plurality of connecting pads and an optical active area are formed on the active surface; a dielectric layer and a circuit layer formed on the active surface, wherein the circuit layer is electrically connected to the connecting pads through electrical conductive vias formed in the dielectric layer; and an opening formed through the dielectric layer to expose the optical active area on the active surface; then an insulating layer is further formed on the circuit layer. By performing a routing process on the wafer to form a plurality of integrated devices with the optical transmitter/receiver components and circuit structures to fulfill the small and lightweight requirements of the electronic device.

9 Claims, 5 Drawing Sheets

SEMICONDUCTOR DEVICE INTEGRATED WITH OPTO-ELECTRIC COMPONENT AND METHOD FOR FABRICATING THE SAME

CROSS-REFERENCE TO RELATED APPLICATION

This application claims benefit under 35 USC 119 to Taiwan Application No. 094129453, filed Aug. 29, 2005.

FIELD OF THE INVENTION

The present invention relates to a semiconductor device integrated with opto-electric component and methods for fabricating the same, and more particularly, to a semiconductor device integrated with an optical transmitter/receiver chip and a circuit structure and a method for fabricating the same.

BACKGROUND OF THE INVENTION

The development of semiconductor technology improves day by day rapidly, besides mainly focusing on the tiny packaging of the model, nowadays the data storage capacity is increasing gradually also. Therefore, with the increasing data quantity, the least time taken to process the same quantity data shows a higher efficiency in data processing. The straightest way to increase the semiconductor's processing rate is to increase the utilization ratio, but facing bottlenecks such as heatsink for high power, delay of signal time and electric magnetic interruption (EMI) when the data transmission is above Gb/s, which makes the fabrication of the higher performance semiconductor more difficult. Especially when the copper circuit is conventionally used as a carrier for data transmission, with the limitation of this material's natural conductivity, the achieved conductivity cannot be increased further, therefore the signal transmission rate cannot be increased by increasing the conductivity.

In addition, the metallic circuit structure for signal transmission is easy to have interruption from the outside noise or interference from the inner circuit, results in signal transmission error due to the interruption and interference during the signal transmission process; therefore, some protection methods are required for the signal transmission structure to prevent the interruption and interference occur to affect the signal, especially obvious in the high frequency transmission. The protection methods have increased some difficulties and extra structure design for the circuit design, results in increasing in the design cost and the fabrication cost, and therefore, the present condition is hard to make a breakthrough.

Moreover, the conventional signal transmission method is an analogue signal transmission method using electricity flowing through the conductor, but the signal processing methods inside the circuits nowadays mostly are digital processing; therefore a distortion may occur after conversion during the transmission process.

In order to resolve the drawbacks from the conventional analogue signal transmission structure, new technique of transmission method is using the optical signal to replace the electrical signal, and the most obvious improvement is that the optical signal almost will not be interrupted by the electromagnetic wave; therefore has a better signal transmission quality and reduce the signal transmission distortion. Also the structure design for preventing electromagnetic wave can be decreased, results in reducing the design and fabrication cost. Thus, using optics as a signal transmission method has become a direction in future development.

The conventional way of designing the optoelectronics transmission structure into the printed circuit board's structure, is to add a guiding layer containing organic waveguide film into the printed circuit board, then integrate the assembly of the optoelectronics components and driving components onto the printed circuit board; so the guiding layer can be used as the path for optical signal transmission to achieve the high speed transmission purpose. Referring to FIG. 1 for the U.S. Pat. No. 6,839,476, showing a saturated layer 12 forming above the bottom layer 11, and a plurality of grooves 12a are formed in the saturated layer 12; then place an optical fiber 13 into the groove 12a, and form another top layer 14 above the saturated layer 12 to embed the optical fiber 13 in the saturated layer 12; thereof the optical fiber 13 is a core 13a covered by a cladding 13b outside. Then the two terminals of the optical fiber 13 can be set up with optical emitter and receiver modules and optical passive components, to transmit optical signal by the optical fiber 13 to avoid the drawbacks from electrical signal transmission.

However, the optical fiber 13 is embedded in the saturated layer 12 and the groove 12a, thus the saturated layer 12 needs to have a grooving fabrication first, then places the optical fiber 13 into the groove 12a. An automatic placing movement, like the conventional insertion movement when inserting electronic components into a circuit board, completes the fabrication process of placing the optical fiber 13 into the groove 12a; therefore the speed of the fabrication is slow, and cannot achieve the rapid production purpose.

Moreover, the optical fiber 13 needs to be cut first according to the corresponding groove 12a length, and then places the optical fiber 13 into the groove 12a, which adds another process in the fabrication, therefore increases the fabrication difficulty; and the optical fiber 13 has different lengths, thereof increases the fabrication assorting difficulties, leads to the addition of the whole fabrication's process and complexity, and consequently increases the fabrication cost.

At forming the groove 12a on the saturated layer 12 to place the optical fiber 13, the gap between the groove 12a and another groove 12a needs to be relatively spaced in size design, in order to locate the optical fiber 13 into the saturated layer 12; the distance of the gap affects the wiring density, also the wiring density is affected by the size of the optical fiber 13's diameter, thus, cannot achieve the purpose of high density wiring.

Beside, the optical fiber 13 used to transmit the optical signal is a core 13a covered by cladding 13b, and the inner layer of the cladding 13b can be used as reflection surface to allow the optical signal reflects forward continuously via the inner layer of the cladding 13b to achieve the signal transmission purpose. The optical fiber 13 and the circuit board have different fabrication structure, thus needs to be fabricated by another independent fabrication process and increases the whole fabrication's difficulty; and to integrate the two different fabrication products increase difficulty as well, thus cannot achieve the mass production purpose to lower the fabrication cost.

Thus, the increasing fabrication difficulty and cost due to optical fiber 13 has to be embedded in the saturated layer 12, and further, failing to meet the high density wiring requirements, has become problems for industries desired to be resolved.

In addition, when using the optical fiber connector for the straight connection, because of the poor performance of the automatic production, a high accuracy alignment equipment is applied for the optical signal transmission and the alignment process is done by hand; this process not only increases the fabrication cost, but also reduces the productivity.

Beside, the use of optics for data transmission of the prior art comprises mainly by the signal processing components, such as the optical fiber, optical connector, optical/electrical converter and electrical/optical converter, thereby complete the digital data transmission; but the high accuracy optical alignment and the system are huge in dimension, which is a disadvantage in the current small and lightweight designing trend. Moreover, the above optical connector, optical/electrical converter and electrical/optical converter are placed on the surface of the package substrate, thus occupied part of the substrate surface and narrows the wiring area on the substrate surface.

Therefore, to provide an integrated device that can solve problems such as meet the small and lightweight electronic device requirement, lower the signal transmission loss, shorten the conduction path, reduce the noise, and thereby, leads to increase the electric performance, improve the bonding alignment, lower the fabrication cost increase the substrate surface's wiring area and increase the productivity, is a problem needs to be solved in industries.

SUMMARY OF THE INVENTION

In light of the above drawbacks in the prior art, an objective of the present invention is to provide a semiconductor device integrated with opto-electric component and method for fabricating the same, to achieve the structure of the wafer package by forming the circuit structure in the wafer, to meet the requirement for a small and lightweight electronic device.

Another objective of the present invention is to provide a semiconductor device integrated with opto-electric component and method for fabricating the same, to increase the aligning precision when circuits bond to components by applying the flip chip bonding.

A further objective of the present invention is to provide a semiconductor device integrated with opto-electric component and method for fabricating the same, to lower the signal transmission loss, shorten the conduction path, reduce the noise and increase the electric performance.

In accordance with the above and other objectives, the present invention of method for fabricating a semiconductor device integrated with opto-electric component comprising the steps of: providing a wafer with a plurality of first optical transmitter/receiver components, each of the first optical transmitter/receiver components having an active surface and an opposite non-active surface, wherein a plurality of connecting pads and an optical active area are formed on the active surface; forming a dielectric layer on the active surface of the optical transmitter/receiver components on the wafer; and forming a circuit layer on the dielectric layer, wherein the circuit layer is electrically connected to the connecting pads of the first optical transmitter/receiver components through electrical conductive vias formed in the dielectric layer, and an opening is formed in the dielectric layer at a position corresponding to the optical active area on the active surface of each of the optical transmitter/receiver components to expose the optical active area.

The above method for fabricating a semiconductor device integrated with opto-electric component further comprises forming an insulating layer on the circuit layer to protect the circuit layer underneath, and the insulating layer is formed with openings to expose the electrically connecting pads in the circuit layer. Then performing a routing process on the wafer that is formed with the dielectric layer and the circuit layer, to become a plurality of integrated devices with first optical transmitter/receiver components and circuit structures.

Beside, in the method above, further comprises mounting a second optical transmitter/receiver component on the electrically connecting pads exposed from the insulating layer, wherein an optical active area of the second optical transmitter/receiver component corresponds to one of the openings penetrating the dielectric layer and faces the optical active area of a corresponding one of the first optical transmitter/receiver components.

Another fabrication method of the prevent invention is to have a circuit build-up fabrication on the aforementioned wafer that has dielectric layer and circuit layer formed therein. To form a circuit build-up structure on the circuit layer, the circuit build-up structure is electrically connected to the circuit layer, wherein an opening is formed in the circuit build-up structure and the dielectric layer at a position corresponding to the optical active area on the active surface of each of the first optical transmitter/receiver components, to expose the optical active area on the active surface of each of the first optical transmitter/receiver components. There is an insulating layer forming on an outer surface of the circuit build-up structure, wherein the insulating layer is formed with openings to expose electrically connecting pads on the outer surface of the circuit build-up structure, then performing a routing process on the wafer that is formed with the dielectric layer, the circuit layer and the circuit build-up structure to become a plurality of integrated devices with first optical transmitter/receiver components and circuit structures.

Beside, in the above build-up circuit formed in the semiconductor device integrated with opto-electric component, further comprises mounting a second optical transmitter/receiver component on the electrically connecting pads exposed from the insulating layer, wherein an optical active area of the second optical transmitter/receiver component corresponds to one of the openings penetrating the dielectric layer and faces the optical active area of a corresponding one of the first optical transmitter/receiver components.

The present invention of a semiconductor device integrated with opto-electric component comprises a first optical transmitter/receiver component having an active surface and an opposite non-active surface, wherein a plurality of connecting pads and an optical active area are formed on the active surface; a dielectric layer formed on the active surface of the first optical transmitter/receiver component; a circuit layer formed on the dielectric layer, wherein the circuit layer is electrically connected to the connecting pads of the first optical transmitter/receiver component through electrical conductive vias formed in the dielectric layer; and an opening formed through the dielectric layer to expose the optical active area on the active surface of the first optical transmitter/receiver component.

The above integrated device further comprises an insulating layer formed on the circuit layer, wherein the insulating layer is formed with openings to expose electrically connecting pads in the circuit layer.

Beside, the above integrated device further comprises mounting a second optical transmitter/receiver component on the electrically connecting pads exposed from the insulating layer, wherein an optical active area of the second optical transmitter/receiver component corresponds to one of the openings penetrating the dielectric layer and faces the optical active area of a corresponding one of the first optical transmitter/receiver components.

Another semiconductor device integrated with opto-electric component of the present invention comprises: a first optical transmitter/receiver component having an active surface and an opposite non-active surface, wherein a plurality of connecting pads and an optical active area are formed on the active surface; a dielectric layer formed on the active surface of the first optical transmitter/receiver component; a circuit layer formed on the dielectric layer, wherein the circuit layer is electrically connected to the connecting pads of the first optical transmitter/receiver component through electrical conductive vias formed in the dielectric layer; a circuit build-up structure formed on the dielectric layer and the circuit layer, the circuit build-up structure being electrically connected to the circuit layer, wherein an opening is formed through the dielectric layer and the circuit build-up structure to expose the optical active area on the active surface of the first optical transmitter/receiver component.

The above semiconductor device integrated with opto-electric component further comprises an insulating layer formed on an outer surface of the circuit build-up structure, wherein the insulating layer is formed with openings to expose electrically connecting pads on the outer surface of the circuit build-up structure.

Beside, the above semiconductor device integrated with opto-electric component can further comprise a second optical transmitter/receiver component mounted on the electrically connecting pads exposed via the openings of the insulating layer, wherein the optical active area on an active surface of the second optical transmitter/receiver component corresponds to the openings of the circuit build-up structure and the dielectric layer, and faces the optical active area of the first optical transmitter/receiver component.

Therefore, the present invention of a semiconductor device integrated with opto-electric component and method for fabricating the same is to form an opening on a wafer with a plurality of optical transmitter/receiver components to expose the single layer or the multi-layer circuit structure of the optical active area of the optical transmitter/receiver components. To allow the circuit of the single layer or the multi-layer circuit structures to be electrically connected to the connecting pads of the optical transmitter/receiver components directly in order to improve the bonding alignment between the circuit and the connecting pads of the optical transmitter/receiver components. Afterwards, performing a routing process formed a plurality of integrated devices with single optical transmitter/receiver component to achieve the chip packaging of the optical transmitter/receiver component, therefore leads to a reduced product's package volume to form an integrated device meeting the requirement of the small and lightweight electronic devices, and therewith, lowers the signal transmission loss, shortens the transmission path and reduces the noise to improve the optoelectronics' quality by the integration of the optoelectronics.

In addition, the present invention of a semiconductor device integrated with opto-electric component, wherein the two terminals of the openings of the single layer or multi-layer of the circuit structures can connect to two optical transmitter/receiver components respectively, and the optical active areas on the active surfaces of the two optical transmitter/receiver components faces each other to form a module of the integrated device, to fulfill the continuous improvement requirement for the electronic device.

DETAILED DESCRIPTION OF THE PERFERRED EMBODIMENTS

FIGS. 2A to 2D show the first preferred embodiment's fabrication flowchart of the present invention of the semiconductor device integrated with opto-electric component. Please notice that all the diagrams are simplified schematic diagrams only, and only used to represent the fabrication process of the present invention. Furthermore, the diagrams only show the components relating to the present invention, and the showing components are not in their actual condition when operation; the design of the components' number, shape and size is selective in actual operation and the components can be arranged in a more complex way.

Figure 1:
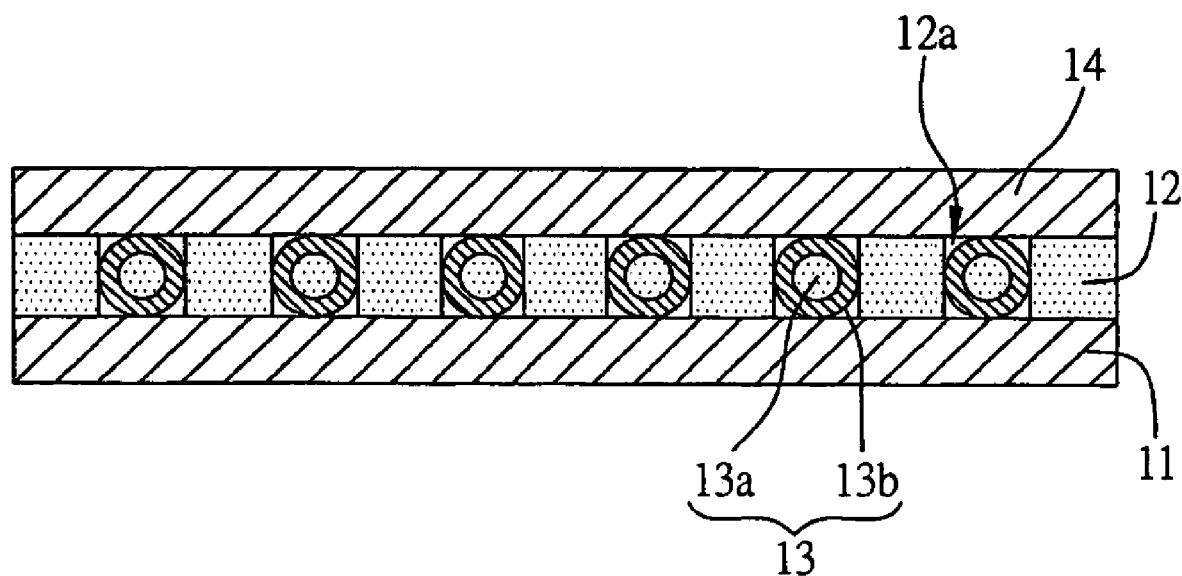
FIG. 1 (prior art) is a cross-sectional diagram of a structure disclosed in U.S. Pat. No. 6,839,476.
Figure 2A:
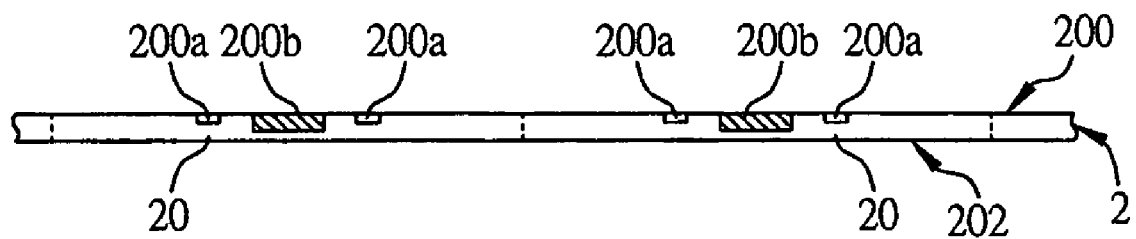
FIGS. 2A-2D are cross-sectional diagrams illustrating steps of a method for fabricating a semiconductor device integrated with opto-electric component according to a first embodiment of the present invention.

As shown in FIG. 2A, first a semiconductor wafer 2 with a plurality of optical transmitter/receiver components 20 is provided, each of the optical transmitter/receiver components 20 having an active surface 200 and a non-active surface 202 opposites to the active surface 200, wherein a plurality of connecting pads 200a and an optical active area 200b are formed on the active surface 200. The optical transmitter/receiver components 20 can be selected from the group consisting of laser diode (LD), light emitting diode (LED), vertical cavity surface emitting laser (VCSEL), photodiode (PD) and photo sensor.

Figure 2B:
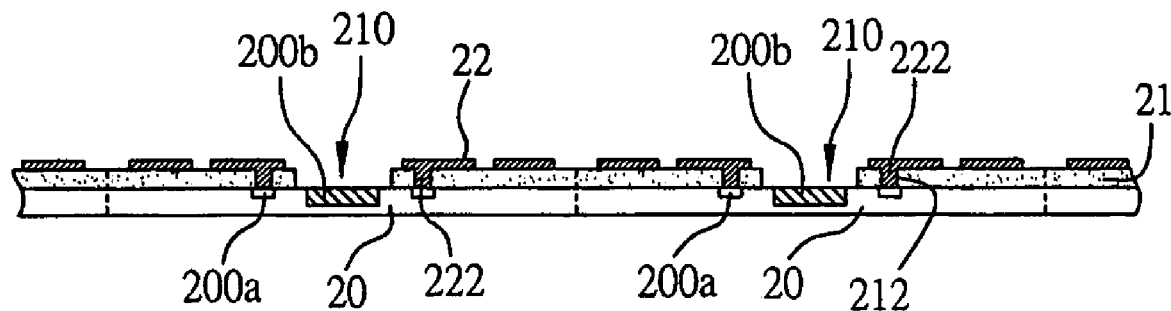

As shown in FIG. 2B, following by forming a dielectric layer 21 and a circuit layer 22 on the wafer 22, wherein the dielectric layer 21 exposes the connecting pads 200a and the optical active area 200b on the active surface of the optical transmitter/receiver components 20. At this preferred embodiment, the dielectric layer 21 can be dielectric material selected from the group consisting of ABF, BCB, LCP or PI, and the dielectric layer 21 is formed on the surface of the wafer 2. At the dielectric layer 21, an opening 210 is formed to expose the optical active area 200b and a plurality of vias 212 are formed to expose the connecting pads 200a. Beside, the dielectric layer 21 can also be made from organic photosensitive liquid resin or film forming resin, and is formed on the surface of the wafer 2; then after pattern fabrication of expose and develop, to form vias 212 to expose the connecting pads 200a and to form an opening 210 to expose the optical active area 200b. The circuit layer 22 is electrically connected to the connecting pads 200a of the optical transmitter/receiver components 20 via the conductive via 222 formed inside the dielectric layer 21, and an opening 210 is formed at the position where the dielectric layer 21 corresponds to the optical active area 200b on the active surface 200 of the optical transmitter/receiver component 20, penetrating to expose the optical active area 200b. The art of forming the circuit layer 22 described here is in variety ways and is well-known by the industries, therefore there is no further explanation here.

At another exemplary preferred embodiment, the opening 210 described above can be filled with an organic material that has a light guiding property, to transmit the optical signal.

Figure 2C:
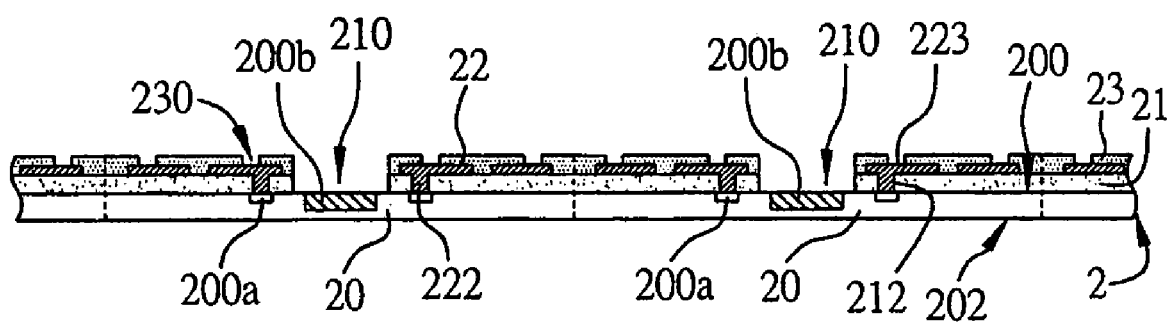

As shown in FIG. 2C, an insulating layer 23 is formed on the surface of the circuit layer 22 formed wafer, and a plurality of openings 230 are formed therein to expose the electrically connecting pads 223 in the circuit layer 22 and the opening 210. The insulating layer 23 described here can be a solder mask layer.

Figure 2D:
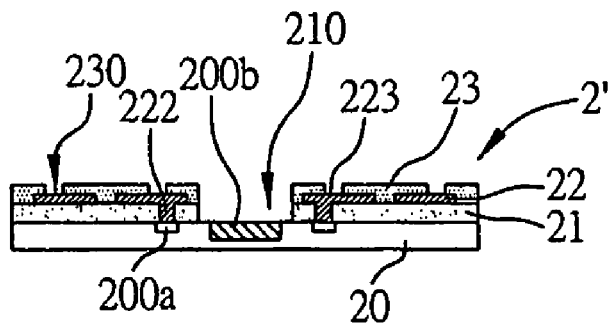

As shown in FIG. 2D, performing a routing process on the wafer 2 that is formed with the dielectric layer and the circuit layer, to become a plurality of integrated devices 2' integrated with the optical transmitter/receiver components 20 and circuit structures, in order to utilize the optics and electrics for signal transmission to increase the electronic devices' electro function and multiple usage function.

Therefore, the above fabrication process forms an integrated device comprising: optical transmitter/receiver components 20 and each of the optical transmitter/receiver components 20 having an active surface 200 and a non-active surface 202 opposite to the active surface 200, wherein a plurality of connecting pads 200a and an optical active area 200b are formed on the active surface 200; a dielectric layer 21 formed on the active surface 200 of the optical transmitter/receiver components 20; a circuit layer 22 formed on the dielectric layer 21 and the circuit layer 22 is electrically connected to the connecting pad 200a via the conductive via 222 in the dielectric layer 21; and an opening 210 is formed to expose the optical active area 200b on the active surface of the optical transmitter/receiver components 20.

The aforementioned integrated device 2' further comprises a insulating layer 23 formed on the circuit layer 22 to protect the circuit layer 22 underneath, wherein the insulating layer 23 is formed with openings 230 to expose the electrically connecting pads 223 in the circuit layer 22. The insulating layer 23 can be a solder mask layer.

Figure 3:
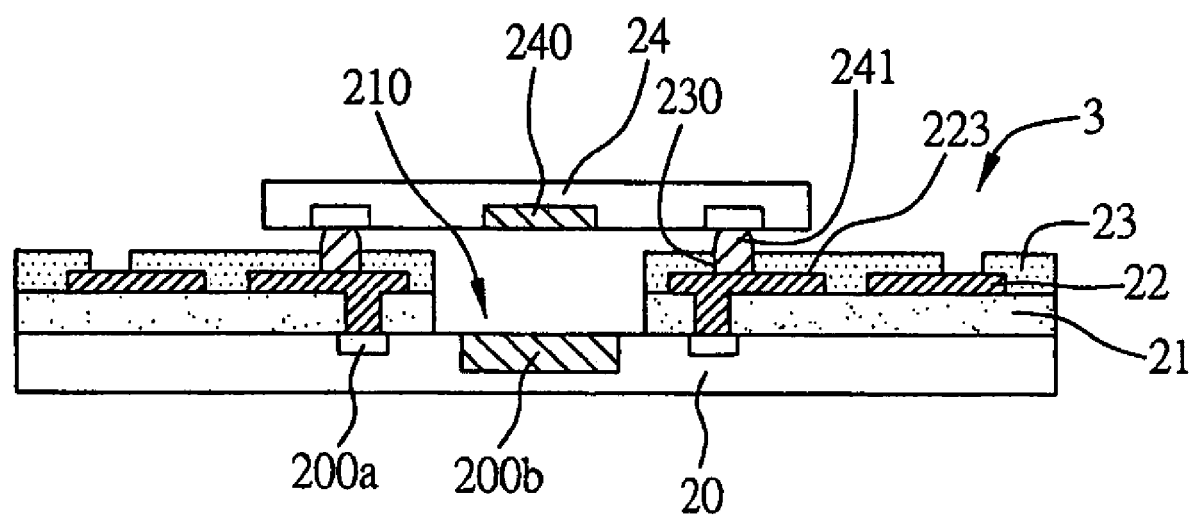
FIG. 3 is a cross-sectional diagram illustrating the semiconductor device integrated with opto-electric component according to a second embodiment of the present invention.

Referring to FIG. 3, it is a cross-sectional diagram illustrating the second exemplary preferred embodiment of the present invention of the semiconductor device integrated with opto-electric component. At the second exemplary preferred embodiment of the present invention, another optical transmitter/receiver component is connected to the integrated device 2' described in the previous first preferred embodiment.

As shown in FIG. 3, at the first optical transmitter/receiver component 20 that has the dielectric layer 21, the circuit layer 22 and the insulating layer 23 fabricated in the first exemplary preferred embodiment (as shown in FIG. 2D), the electrically connecting pads 223 corresponding to circuit layer 22 are connected to a second optical transmitter/receiver component 24. As shown in the diagram, the second optical transmitter/receiver component 24 uses the electrically connecting component 241 (such as solder ball) to connect to the electrically connecting pads 223 exposed by the openings 230 of the insulating layer 23, wherein the optical active area 240 on the active surface of the second optical transmitter/receiver components 24 corresponds to one of the openings 210 and faces the optical active area 200b on the active surface of a corresponding one of the first optical transmitter/receiver components 20. Now an integrated device 3 has formed, which is the setup of the first optical transmitter/receiver components 20 and the second optical transmitter/receiver components 24 at the two sides of the opening 210 corresponding to each other, to allow the signal from the first and the second optical transmitter/receiver component 20 24 to be transmitted and received directly, hence increasing the semiconductor device's electro function.

Figure 4A:
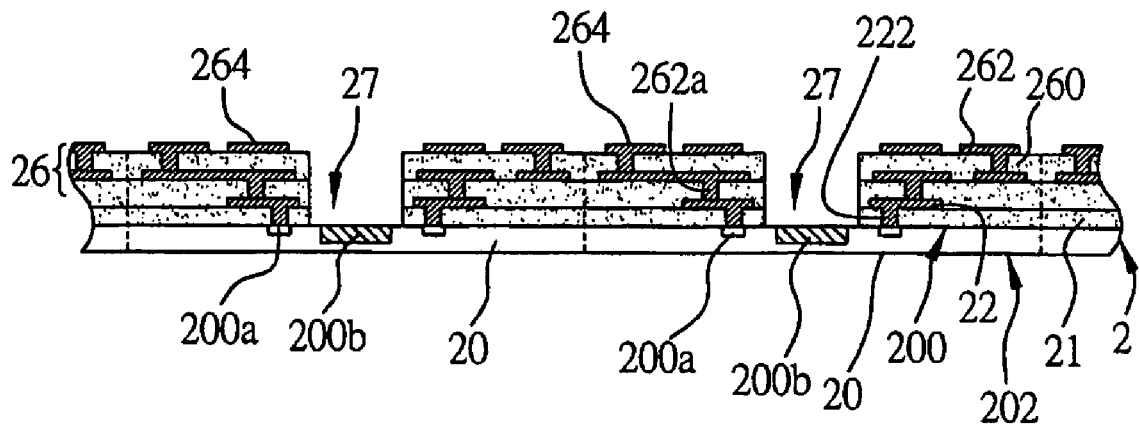
FIG. 4A-4C are cross-sectional diagrams illustrating steps of the method for fabricating the semiconductor device integrated with opto-electric component according to a third embodiment of the present invention.
Figure 4B:
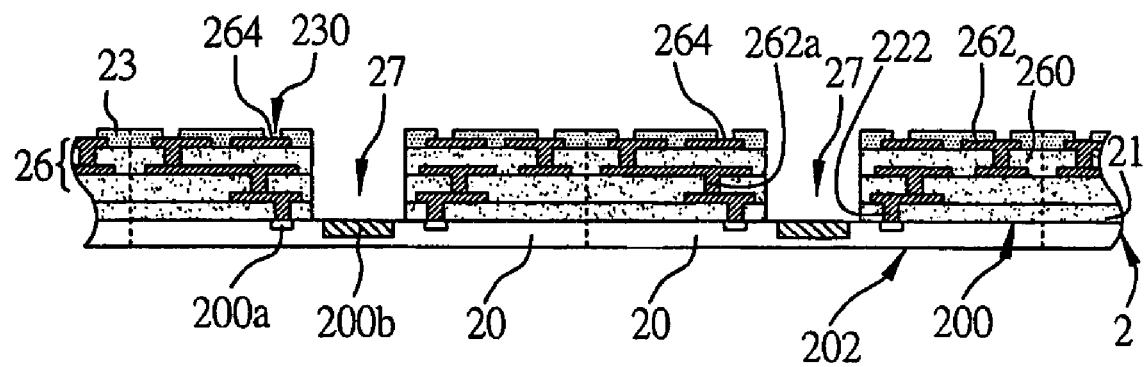
Figure 4C:
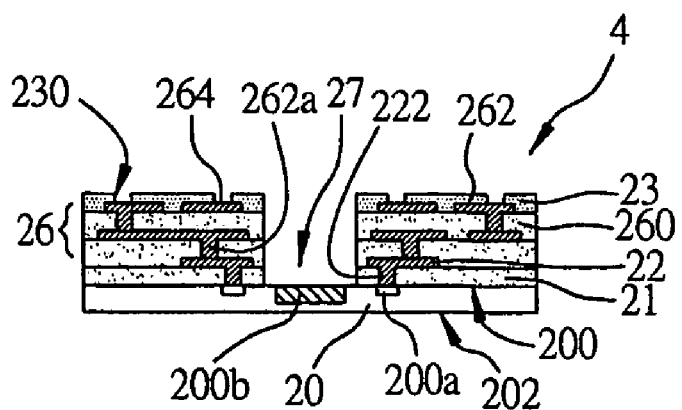

Referring to FIGS. 4A and 4C, they are the cross-sectional diagrams of the third exemplary preferred embodiment showing the fabrication method of the present invention of the semiconductor device integrated with opto-electric component. At the third preferred embodiment of the present invention, a circuit build-up fabrication is processed on the circuit layer 22 of the aforementioned first preferred embodiment, to form a required electro designed circuit board.

As shown in FIG. 4A, a circuit build-up fabrication is processed on the aforementioned wafer 2 of the first preferred embodiment that has the dielectric layer 21 and the circuit layer 22 formed therein to form a circuit build-up structure 26 on the circuit layer 22 and the circuit build-up structure is electrically connected to the circuit layer 22.

The circuit build-up structure 26 comprises: a dielectric layer 260, a circuit layer 262 build-up on the dielectric layer 260, and the conductive via 262a penetrating through the dielectric layer 260 to allow the circuit layer 262 to be electrically connected to the circuit layer 22. And the outer surface of the circuit build-up structure 26 is formed with a plurality of electrically connecting pads 264, wherein the dielectric layer 21 and the circuit build-up structure 26 correspond to the optical active area 200b on the active surface 200 of the first optical transmitter/receiver component are formed with openings 27 penetrating the dielectric layer 21 and the circuit build-up layer 26 to expose the optical active area 200b.

At another exemplary preferred embodiment of the present invention, the opening 27 described above can be filled with an organic material that has a light guiding property, to transmit the optical signal.

As shown in FIG. 4B, an insulating layer 23 is formed on the surface of the outer circuit layer of the circuit build-up structure and the insulating layer 23 is formed with a plurality of openings to expose the electrically connecting pads 264 of the outer circuit layer.

As shown in FIG. 4C, then by performing a routing process to cut the wafer 2 with multi-layer circuit to become a plurality of integrated devices 4 integrated with first optical transmitter/receiver components 20 and circuit structures.

The integrated device 4 of the present invention formed by the fabricating steps described above comprises: a first optical transmitter/receiver component 20 that having an active surface 200 and a non-active surface 202 opposite to the active surface 200, wherein a plurality of connecting pads 200a and an optical active area 200b are formed on the active surface 200; a dielectric layer 21 formed on the active surface 200 of the optical transmitter/receiver component 20; a circuit layer 22 formed on the dielectric layer 21, wherein the circuit layer 22 is electrically connected to the connecting pads 200a via the conductive via 222 in the dielectric layer 21; a circuit build-up structure 26 formed on the circuit layer 22 and the circuit build-up structure is electrically connected to the circuit layer 22; and an opening 27 formed through the dielectric layer 21 and the circuit build-up structure 26 to expose the optical active area 200b on the active surface of the first optical transmitter/receiver component 20.

The circuit build-up structure 26 described above comprises: a dielectric layer 260, a circuit layer 262 built up on the dielectric layer 260, and a conductive via 262a penetrating through the dielectric layer 260 to allow the circuit layer 262 to be electrically connected to the circuit layer 22. And the outer surface of the circuit build-up structure 26 is formed with a plurality of electrically connecting pads 264.

Beside, the integrated device 4 described above also comprises an insulating layer 23 formed on the outer surface of the circuit build-up structure 26, and the insulating layer 23 is formed with a plurality of openings 230 to expose the electrically connecting pad 264 of the outer circuit layer 22 of the circuit build-up structure 26.

Figure 5:
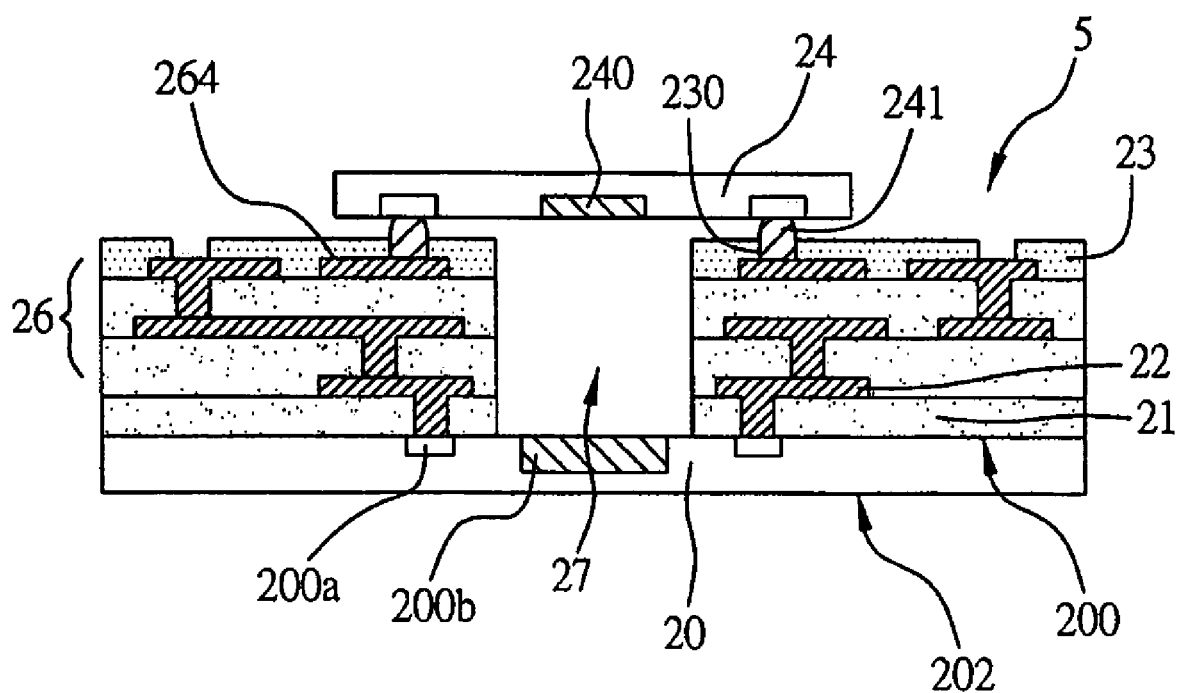
FIG. 5 is a cross-sectional diagram illustrating the semiconductor device integrated with opto-electric component according to a fourth embodiment of the present invention.

Referring to FIG. 5, which is the cross-sectional diagram of the fourth exemplary preferred embodiment. At the fourth preferred embodiment of the present invention, an optical transmitter/receiver component can be connected to the integrated device 4 of the aforementioned third preferred embodiment.

As shown in FIG. 5, at the optical transmitter/receiver component 20 that has the dielectric layer 21, the circuit layer 22, the circuit build-up structure 26 and the insulating layer 23 fabricated in the third exemplary preferred embodiment (as shown in FIG. 3C), the electrically connecting pads 264 corresponding to the outer surface of the circuit build-up structure layer 22 are connected to the second optical transmitter/receiver component 24. As shown in the diagram, the second optical transmitter/receiver component 24 uses the electrically connecting component 241 (such as solder ball) to connect to the electrically connecting pads 264 exposed by the openings 230 of the insulating layer 23, wherein the optical active area 240 on the active surface of the second optical transmitter/receiver component 24 corresponds to the opening 27 and faces the optical active area 200b on the active surface of the first optical transmitter/receiver component 20, to form an integrate device 5.

Therefore, the present invention of the semiconductor device integrated with opto-electric component and method for fabricating the same, is to form an opening on a wafer with a plurality of optical transmitter/receiver components to expose the single layer or the multi-layer circuit structures of the optical active area of the optical transmitter/receiver components, and also to allow the circuits of the single layer or the multi-layer circuit structures to be electrically connected to the connecting pads of the optical transmitter/receiver components directly, in order to improve the bonding alignment between the circuit and the connecting pads of the optical transmitter/receiver components. Afterwards, performing a routing process to form a plurality of integrated devices integrating the optical transmitter/receiver component and the circuit structure to achieve the chip packaging of the optical transmitter/receiver component, therefore leads to a reduced product's package volume to form an semiconductor device integrated with opto-electric component meeting the requirement of the small and lightweight electronic devices, and therewith, lowers the signal transmission loss, shortens the transmission path and reduces the noise to improve the electric performance.

In addition, in the present invention of the semiconductor device integrated with opto-electric component, the two terminals of the opening of the single layer or multi-layer of the circuit structures can connect to two optical transmitter/receiver components respectively, and further the optical active area on the active surface of the two optical transmitter/receiver components are facing to each other to form a module of the integrated device, to fulfill the continuous improvement requirement for the electronic device.

The present invention has been described using exemplary preferred embodiments above, however, it is to be understood that the scope of the present invention is not limited to the disclosed embodiments. On the contrary, it is intended to cover various modifications and similar changes. The scope of the claims, therefore, should be accorded the broadest interpretation so as to encompass all such modifications and similar arrangements.

What is claimed is:

1. A method for fabricating a semiconductor device integrated with opto-electric component, comprising the steps of:
providing a wafer with a plurality of first optical transmitter/receiver components, each of the first optical transmitter/receiver components having an active surface and an opposite non-active surface, wherein a plurality of connecting pads and an optical active area are formed on the active surface;
forming a dielectric layer on the wafer;
forming a circuit layer on the dielectric layer, wherein the circuit layer is electrically connected to the connecting pads of the first optical transmitter/receiver components through electrical conductive vias formed in the dielectric layer and disposed onto the connecting pads, and an opening is formed in the dielectric layer at a position corresponding to the optical active area on the active surface of each of the optical transmitter/receiver components to expose the optical active area;
forming an insulating layer on the circuit layer and the dielectric layer, wherein the insulating layer is formed with openings to expose electrically connecting pads in the circuit layer;
performing a routing process on the wafer, to form a plurality of integrated devices with the first optical transmitter/receiver components and circuit structures, wherein the size of the dielectric layer formed on each first optical transmitter/receiver component is equal to the size of each first optical transmitter/receiver component, and the size of the insulating layer formed on the circuit layer and the dielectric layer is equal to the size of each first optical transmitter/receiver component; and
mounting a second optical transmitter/receiver component on the electrically connecting pads exposed from the insulating layer, wherein an optical active area of the second optical transmitter/receiver component corresponds to one of the openings penetrating the dielectric layer and faces the optical active area of a corresponding one of the first optical transmitter/receiver components, to form a plurality of integrated devices with the first and second optical transmitter/receiver components.

2. The method of claim 1, wherein the insulating layer is a solder mask layer.

3. The method of claim 1, wherein the first and second optical transmitter/receiver components are selected from the group consisting of laser diode (LD), light emitting diode (LED), vertical cavity surface emitting laser (VCSEL), photodiode (PD) and photo sensor.

4. The method of claim 1, wherein the openings are filled with an organic material with a light guiding property.

5. The method of claim 1, further comprising forming a circuit build-up structure between the circuit layer and the insulating layer, the circuit build-up structure being electrically connected to the circuit layer, wherein an opening is formed in the circuit build-up structure and the dielectric layer at a position corresponding to the optical active area on the active surface of each of the first optical transmitter/receiver components, to expose the optical active area on the active surface of each of the first optical transmitter/receiver components.

6. A semiconductor device integrated with opto-electric component, comprising:
a first optical transmitter/receiver component having an active surface and an opposite non-active surface, wherein a plurality of connecting pads and an optical active area are formed on the active surface;
a dielectric layer formed on the active surface of the first optical transmitter/receiver component;
a circuit layer formed on the dielectric layer, wherein the circuit layer is electrically connected to the connecting pads of the first optical transmitter/receiver component through electrical conductive structures formed in the dielectric layer; and disposed onto the connecting pads;

an opening formed through the dielectric layer to expose the optical active area on the active surface of the first optical transmitter/receiver component;

an insulating layer formed on the circuit layer and the dielectric layer to protect the circuit layer, wherein the insulating layer is formed with openings to expose electrically connecting pads in the circuit layer, the size of the dielectric layer formed on each first optical transmitter/receiver component is equal to the size of each first optical transmitter/receiver components, and the size of the insulating layer formed on the circuit layer and the dielectric layer is equal to the size of each first optical transmitter/receiver component; and a second optical transmitter/receiver component mounted on the electrically connecting pads, and an optical active area of an surface of the second optical transmitter/receiver component corresponds to the opening and faces the optical active area of the first optical transmitter/receiver component.

7. The semiconductor device integrated with opto-electric component of claim 6, wherein the opening is filled with an organic material with a light guiding property.

8. The semiconductor device integrated with opto-electric component of claim 6, wherein the first and second optical transmitter/receiver components are selected from the group consisting of laser diode (LD), light emitting diode (LED), vertical cavity surface emitting laser (VCSEL), photodiode (PD) and photo sensor.

9. The semiconductor device integrated with opto-electric component of claim 6, further comprising a circuit build-up structure formed on the dielectric layer and the circuit layer between the circuit layer and the insulating layer, circuit build-up structure being electrically connected to the circuit layer, wherein an opening is formed through the dielectric layer and the circuit build-up structure to expose the optical active area on the active surface of the first optical transmitter/receiver component.

* * * * *